United States Patent [19]

Hodges

[11] 3,751,680

[45] Aug. 7, 1973

[54] DOUBLE-CLAMPED SCHOTTKY TRANSISTOR LOGIC GATE CIRCUIT

[75] Inventor: David A. Hodges, Berkeley, Calif.

[73] Assignee: Signetics Corporation, Sunnyvale, Calif.

[22] Filed: Mar. 2, 1972

[21] Appl. No.: 231,185

[52] U.S. Cl. .................. 307/213, 307/237, 307/254, 307/300

[51] Int. Cl. .............................................. H03k 17/00

[58] Field of Search .................... 307/317, 300, 237, 307/255, 213, 218

[56] References Cited

UNITED STATES PATENTS

| | | | |
|---|---|---|---|
| 3,643,230 | 2/1972 | Lynes | 307/317 X |
| 3,571,616 | 3/1971 | Andrews | 307/218 |
| 3,157,797 | 11/1964 | Eshelman | 307/255 X |
| 3,031,588 | 4/1962 | Hilsenrath | 307/255 X |

*Primary Examiner*—John W. Huckert
*Assistant Examiner*—B. P. Davis
*Attorney*—Paul D. Flehr, Jerry G. Wright et al.

[57] ABSTRACT

A double-clamped Schottky transistor logic gate circuit which includes a totem pole output with Schottky clamp transistors with the pull-down transistor supplying a stable low output level and the pull-up transistor provides a high stable output level voltage by use of a negative feedback arrangement which includes level shifting Schottky diodes and a second Schottky clamp transistor to control the current to the pull-up transistor. An output gating arrangement utilizing Schottky diodes provides reduced capacitances and chip area by placing the cathode of the diode in the same isolated integrated semiconductor regions as the collector of the pull-down transistor. In addition, temperature compensation is provided and noise immunity is improved by integrating a voltage regulator into the same integrated circuit.

8 Claims, 4 Drawing Figures

DOUBLE-CLAMPED SCHOTTKY TRANSISTOR LOGIC GATE CIRCUIT

BACKGROUND OF THE INVENTION

The advent of Schottky-clamped transistors and Schottky barrier diodes which exhibit no significant charge storage effects makes possible substantial improvements in the performance of saturating-type digital circuits. At the present time Schottky process logic components are employed in standard transistor-transistor-logic (TTL) circuits in the form of the Schottky diode clamping of transistors. However, the full advantages of Schottky components in providing high speed, low power digital circuits have not yet been realized.

OBJECTS AND SUMMARY OF THE INVENTION

It is, therefore, an object of the invention to provide an improved high speed, low-power gate circuit using Schottky components.

In accordance with the above object there is provided a gate circuit having an output terminal switchable between two levels in response to a bi-level input signal on an input terminal. A totem pole output arrangement includes a pair of series connected Schottky clamped transistors, the first acting as a pull-up and the second a pull-down transistor. A common connection between the emitter and collector of the transistors provides the output terminal. A phase-splitting OR gate is provided for driving the base inputs of the transistors in a complementary manner. The OR gate has two activating inputs, the first being responsive to a high bi-level input signal for placing the pull-down transistor in conduction and holding off the pull-up transistor. The second input is responsive only during a low bi-level input signal to the first input. It receives a feedback signal from the output terminal for controlling the pull-up transistor to maintain the output terminal at a predetermined higher voltage level.

DETAILED DESCRIPTION OF THE PREFERRED EMBODIMENT

Figures 1, 1A, 2, 3:
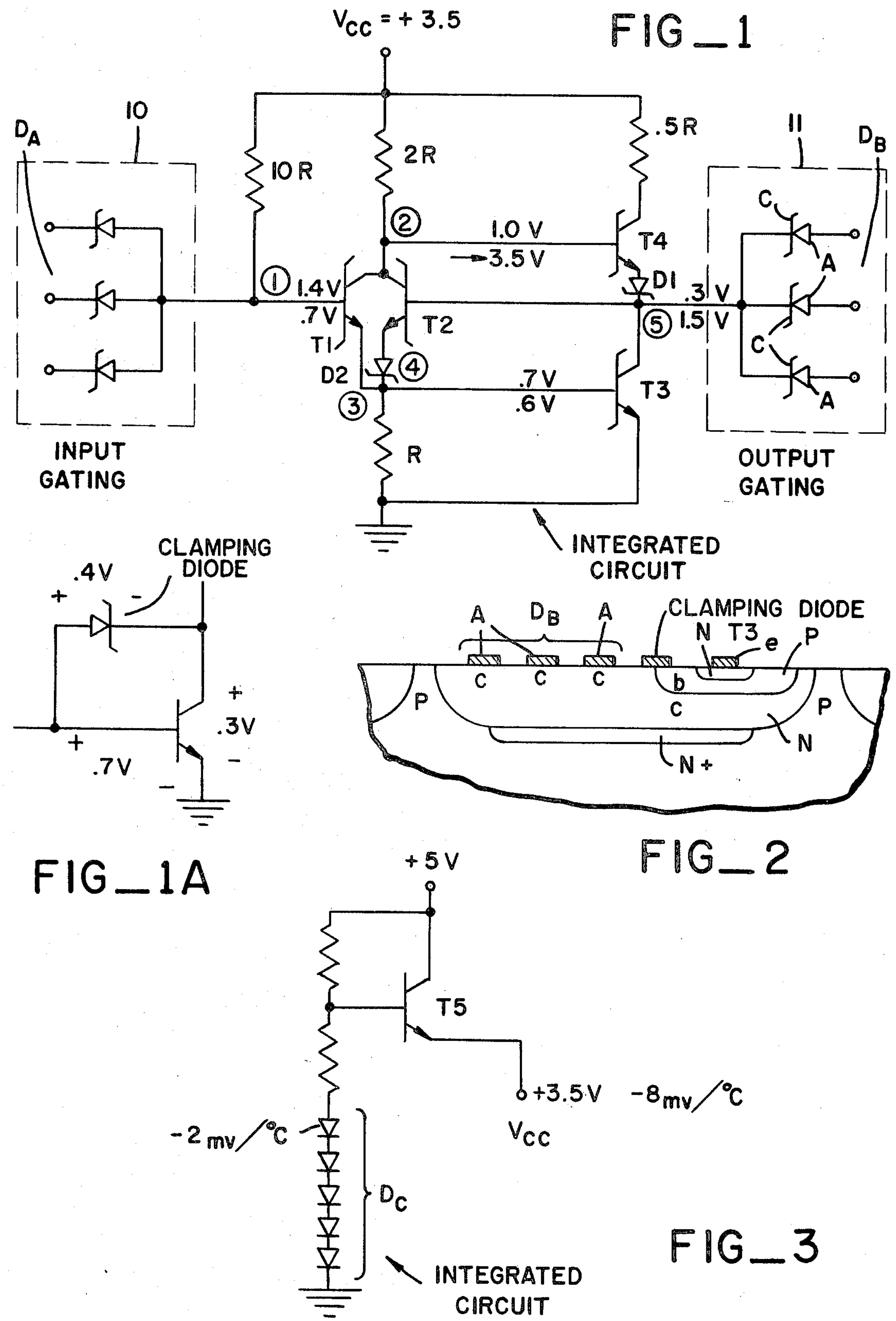
FIG. 1 is a circuit diagram of an integrated circuit embodying the present invention.
FIG. 1A is a more detailed circuit of a portion of FIG. 1.
FIG. 2 is a cross-section of a portion of the integrated circuit of FIG. 1.
FIG. 3 is a circuit diagram of the power supply of FIG. 1.

FIG. 1 illustrates the integrated gate circuit of the present invention with the node 1 being the input terminal. Under nominal operating conditions, node 1 is driven from a low-level voltage of 0.7 volts to a high level of 1.4 volts. In response to this bi-level input the output terminal at node 5 varies in an inverse manner from a high of 1.5 volts to a low logic level of 0.3 volts. As will be explained in detail below these foregoing two output levels at the output terminal at node 5 are stabilized and moreover provide a symmetrical noise margin centered substantially around 0.9 volt with the swing being ±.6 volts to produce the 1.5 and 0.3 volt levels, respectively.

Input gating is indicated in the dashed block 10 and output gating in the dashed block 11. These are actually alternative options depending on the logic format of the medium scale or large scale integrated circuit of which the present gate is a part. Input gate 10 consists of three Schottky barrier diodes designated $D_A$ and the optional output gating of circuit 11 consists of three Schottky barrier diodes designated $D_B$ with their cathodes coupled in common to node 5 and their anode coupled to individual terminals.

The input gating option provides for better noise immunity which is important when the input is driven by long lines. The output gating option reduces net capacitance since the common cathode diode array can be fabricated directly on the N epitaxial collector region of transistor T3 as shown by the cross-section in FIG. 2. There the three diodes $D_B$ are indicated as being formed by a Schottky process with their anodes, A, being metalized and their respective cathodes, C, being the common N substrate which also forms the collector of transistor T3. The N+ region is for reducing series resistance, while the P type chimneys are for isolation purposes. The base, collector, and emitter of transistor T3 are also indicated. This gating configuration allows a much smaller silicon chip area to be used since the common N region is very efficiently shared. The smaller area thus results in a smaller capacitance for reduced logic delay and/or reduced power consumption. This type of output gating circuit is most practical in medium scale or large scale integrated circuits where the lead connections between it and the next adjacent circuit will be quite small.

Referring again to the circuit of FIG. 1 the voltages of various nodes 1 through 5 are given with the voltages below the lines all being related to a low input and high output level voltage and the voltages above the lines corresponding to a high level input and low level output. Typical relative values of the resistors are also given for purposes of illustration. The transistors T1, T2, T3 and T4 are all Schottky clamped transistors. In other words, they are of the type shown in FIG. 1A which actually consists of a normal transistor with a Schottky barrier diode coupled between the collector and base of the transistor. The saturation voltage of the transistor will now be 0.3 volts since the 0.4 volt Schottky diode drop substracts from the normal base-emitter drop of 0.7 volts.

Pull-up transistor T4 has its collector coupled through the resistor .5R to $V_{cc}$ which is a nominal 3.5 volts and pull-down transistor T3 has its emitter coupled to ground. The output at node 5 is formed by the tied collector and emitter of T3 and T4 respectively. Diode D1 which is of the Schottky type is series coupled between node 5 and the emitter of T4 and acts as a level shifter.

Transistors T3 and T4 form a typical totem pole arrangement where in either of the logical output states the supply current being drawn is low. With a low 0.3 volt output T3 is on, the 0.3 volt drop across the saturated transistor producing this output. In the high output condition or 1.5 volts, T4 is conducting only enough current to drive the base of T2. Maximum power is consumed only in switching from one logic level to the other logic level.

T3 and T4 act in a complementary manner. Their base inputs are driven at nodes 2 and 3 by the tied collectors and emitters of transistors T1 and T2. Node 2 is also coupled through resistor 2R to $V_{cc}$ and node 3 through resistor R to ground or common. The node 1 input of transistor T1 is, of course, responsive to the bi-level input signal at node 1 and the T2 transistor by its base input to a feedback signal from the output terminal at node 5. Level shifting Schottky diode D2 between the emitters of T2 and T3 at node 3 allows node 5 to swing upward to 1.5 volts as desired. An alternative location of D2 is at the base of T2.

Transistors T1 and T2 act as a phase-splitting OR gate.

Transistor T4 can thus be termed a pull-up transistor since when it is on it pulls up the node 5 to 1.5 volts or pulls this node toward the $V_{cc}$ voltage and T3 a pull-down transistor since it pulls down node 5 toward the ground level and maintains node 5 at the saturation drop of the transistor T3 away from the ground level.

Node 1 is coupled to $V_{cc}$ through resistor 10R which is a typical current sinking logic gate configuration where there is a resistor up to the supply voltage at the input terminal.

A first feedback loop which serves to stablize the 1.5 volt output voltage is formed by node 5, transistor T2, node 2 and transistor T4. This negative feedback loop controls the pull-up transistor T4 to maintain the output terminal or node 5 at its predetermined upper voltage level of 1.5 volts. This operating point where, of course, the input voltage is at the low level of 0.7 volts, is also further stablized by a second negative feedback path which includes T2 acting as an emitter follower, diode D2, node 3, T3 acting as an inverter and back to the base of T2 through node 5.

In the high level input condition, that is, 1.4 volts which means a low level output of .3 volts the operating voltage is, of course, stabilized by the Schottky clamp transistor T3 as explained above which provides a saturation voltage of 0.3 volts.

OPERATION

With a low input voltage of .7 volts or less at node 1, T1 is non-conducting. This can be verified by following the path from node 1 through T1 past node 3 and through T3. In order for T1 to be conducting a substantial current, the total voltage drop through this path would have to be sufficient to turn on both T1 and T3 which would be 0.7 volts for each transistor or 1.4 volts. Since the voltage at the base of T1 is only .7 volts there cannot be a major path for current from node 1 through node 3 and T3 to ground. There can be a small flow of current through T1 and through R to ground. However, this small flow of current must not be sufficient to raise node 3 to 0.7 volts. The voltage node 3 is stabilized at approximately 0.6 volts by the negative feedback path which includes T3, node 5, T2, D2 and node 3. This is a negative feedback loop since there is only a single phase inversion provided by T3. T2 is acting as an emitter follower. If a variation in component parameters might cause a shift in operating point which would act to raise the voltage at node 3 during the low input state when it is wished to have T3 substantially off, this problem can be corrected by reducing the current through T2. Such current through T2 will be reduced by the action of the negative feedback loop. When node 3 rises in voltage, T3 will conduct slightly reducing the voltage at node 5 and concomitantly reducing the voltage at node 4 thereby reducing the current through T2.

Continuing the operation where there is a low level input voltage of 0.7 volts, since T1 is if anything conducting only a very small current there is a very substantial positive voltage at the base of T4 at node 2 which approaches 3.5 volts. Thus, T4 has a possibility of being in an on or conductive condition. Since T3 is being held off, no current flows down from node 5 to T3 to ground. However, there is a current path from node 5 which provides a drive current to the base of T2. This is in fact the feedback path that stabilizes the high or 1.5volt output voltage at node 5. The voltage at node 5 will rise until T2 begins to conduct. Such conduction drawing current through resistor 2R reduces the voltage at node 2 and this produces a negative feedback effect on T4 reducing its current and thus the voltage at node 5 is stabilized. The feedback path which includes T4, D1, node 5, T2 and node 2 is a negative feedback path since there is only one phase inversion caused by T2 around the loop. T4 is an emitter follower in this configuration and provides no phase inversion.

Assuming that a change occurs at node 1 from 0.7 to 1.4 volts, transistors T3 and T1 will be placed in conduction. The base drive to T1 is equal to approximately one-fifth of the collector current of T1 as determined by the resistor ratio 10R/2R. T1 will be saturated and thus node 3 is at 0.7 volts. Node 2 will be one Schottky clamp saturation voltage above that or about 1.0 volts with respect to ground. With node 3 at 0.7 volts, transistor T3 is turned on and node 5 will be pulled down to one Schottky clamp saturation voltage or 0.3 volts.

There is no wasting of d.c. current flowing through T4 to ground since with 1.0 volts at node 2 and 0.3 volts at node 5 the total voltage across the combination of the base emitter diode of T4 and the diode D1 is only 0.7 volts. This is not sufficient to turn on the transistor and the diode since in fact approximately 1.1 volts is needed; .4 for the Schottky barrier diode and 0.7 for the transistor.

Also, there is no wasting of current in the path through T2 since node 5 is at 0.3 volts. Node 4 cannot be any lower than 0.7 volts because this is the voltage at node 3. Thus, if node 5 is approximately at 0.3 volts T2 cannot be conducting because its emitter base diode is back biased approximately 0.4 volts.

In the low level output condition, the 0.3 volts output voltage is stabilized simply as illustrated in FIG. 1A by the difference in forward drops of the T3 base emitter diode, 0.7 volts, and its Schottky diode connected from the T3 base to its collector. These forward drops are very stable and independent of manufacturing variations.

Thus in summary, the high output voltage of 1.5 volts is stabilized by use of several Schottky components in the feedback arrangement and the low output voltage of 0.3 volts is stabilized by the difference in voltage drops in the two diodes of transistor T3. Also as discussed above, there is no significant wasting of current in either the high or low output voltage states.

Thus, the present invention provides a logic circuit which provides well defined logic levels with a small symmetrical voltage difference. This yields a reduced power-delay product which is approximately given by $C_{tot}$ $V_{cc}$ $V_L$. $C_{tot}$, the capacitance of the circuit, is reduced by the Schottky components, $V_{cc}$ is 3.5 volts compared to 5 volts and $V_L$, the logic swing, is now smaller and symmetrical.

A further advantage of the present invention is illustrated in FIG. 3 where when the circuit of FIG. 1 is used in a standard TTL type circuit which has a nominal +5 voltage power supply. A voltage regulator reduces the standard TTL voltage to substantially +3.5 volts. The regulator shown in FIG. 3 would be integrated in the same substrate as the circuit of FIG. 1 and provides a temperature coefficient of −8 millivolts per degree centigrade. This temperature coefficient matches the temperature coefficient of substantially −8 millivolts per degree centigrade of the circuit of FIG. 1 which is produced by its maximum path of three PN junctions plus two Schottky diodes through T4, D1, T2 D2 and T3. Referring specifically to the circuit of FIG. 3 a transistor T5 is provided having its collector coupled to the +5 volt voltage supply of a standard TTL circuit arrangement and its emitters supplying the nominal 3.5 volts temperature compensated voltage supply to the circuit of FIG. 1. Coupled to the base input through a resistor is a string of five diodes designated $D_C$ each having a temperature coefficient of −2 millivolts per degree centigrade. Thus, the shift of the five diodes is −10 millivolts per degree centigrade in one direction taken in combination with the shift of the emitter base diode of transistor T5 which is in the opposite direction to provide the −8 millivolt characteristic which is desired.

Thus, the present invention has provided an improved high speed, low power gate circuit using Schottky components.

I claim:

1. A gate circuit having an output terminal switchable between two levels in response to a bi-level input signal on an input terminal said circuit comprising: a totem pole arrangement including a pair of series connected Schottky clamped transistors the first acting as a pull-up and the second a pull-down transistor the common connection between the emitter and collector of said transistors providing said output terminal, phase-splitting OR gate means for driving the base inputs of said transistors in a complementary manner said OR gate means having two activating inputs the first input being responsive to a high bi-level input signal for placing said pull-down transistor in conduction and holding off said pull-up transistor, the second input being responsive during a low bi-level input signal to said first input to a feedback signal from said output terminal for controlling said pull-up transistor to maintain said output terminal at a predetermined voltage level.

2. A gate circuit as in claim 1 together with output gating means including a plurality of Schottky diodes with means for connecting their cathodes in common and to said output terminal said connecting means includes a common isolated collector region of one of said pair of transistors which is a portion of an integrated circuit.

3. A gate circuit as in claim 1 together with a semiconductor substrate into which such circuit is integrated said circuit including voltage regulator means integrated into said substrate for reducing the standard TTL power supply voltage of +5 volts to substantially +3.5 volts said regulator including means for providing a net temperature coefficient to compensate the temperature coefficient of said gate circuit.

4. A gate circuit as in claim 3 where said temperature coefficient means includes a transistor coupled to said 5 volt supply and a series string of five PN junction diodes coupled to the base of said transistor to provide a net temperature coefficient of four PN junctions.

5. A gate circuit as in claim 1 where said OR gate means includes a pair of Schottky clamped transistors with their collectors tied together and coupled to the base of said pull-up transistor and with their emitters tied together and coupled to the base of said pull-down transistor the base inputs of said pair of transistors in said OR gate serving as said first and second inputs.

6. A gate circuit as in claim 5 in which a first negative feedback path for controlling said pull-up transistor includes said OR gate transistor which provides said second input said output terminal and said pull-up transistor.

7. A gate circuit as in claim 6 where a second negative feedback path is formed by such OR gate transistor said pull-down transistor and said output terminal.

8. A gate circuit as in claim 7 where said second negative feedback path includes a Schottky diode series connected between the emitter of such OR gate transistor and said pull-down transistor and serving as a level shifter.

* * * * *